United States Patent [19]
Klingler

[11] Patent Number: 5,948,114
[45] Date of Patent: Sep. 7, 1999

[54] INTEGRATED CIRCUIT BINARY DATA OUTPUT INTERFACE FOR MULTIPLEXED OUTPUT OF INTERNAL BINARY INFORMATION ELEMENTS FROM INPUT/OUTPUT PADS

[75] Inventor: Stephan Klingler, Bailly, France

[73] Assignee: SGS-Thomson Microelectronics, S.A., Saint Genis, France

[21] Appl. No.: 08/618,920

[22] Filed: Mar. 20, 1996

[30] Foreign Application Priority Data

Mar. 21, 1995 [FR] France ................................ 95 03455

[51] Int. Cl.[6] .................................................. G01R 31/28
[52] U.S. Cl. ........................... 714/733; 714/734; 365/201
[58] Field of Search .................... 714/733, 734, 714/718; 365/201; 324/158.1

[56] References Cited

U.S. PATENT DOCUMENTS

| | | | |
|---|---|---|---|
| 4,929,889 | 5/1990 | Seiler et al. .............................. | 371/23.3 |
| 5,469,075 | 11/1995 | Oke et al. ................................. | 324/763 |
| 5,594,694 | 1/1997 | Roohparvar et al. .................... | 365/201 |
| 5,706,235 | 1/1998 | Roohparvar et al. .................... | 365/201 |

FOREIGN PATENT DOCUMENTS

| | | | |
|---|---|---|---|
| A-0 023 419 | 2/1981 | European Pat. Off. | ......... G01R 31/28 |
| A-0 414 014 | 2/1991 | European Pat. Off. | ......... G01R 31/28 |
| A-0 529 945 | 3/1993 | European Pat. Off. | ......... G11C 29/00 |

*Primary Examiner*—Hoa T. Nguyen
*Attorney, Agent, or Firm*—Wolf, Greenfield & Sacks, P.C.

[57] ABSTRACT

Disclosed is an output interface for an integrated circuit permitting input and output pads to selectively receive binary data elements or electrical signals from multiple sources. The output interface contains a storage mechanism that stores the N binary information elements present on N internal lines of the integrated circuit and a multiplexer that presents the binary information in packets of K bits to a connection mechanism. Upon direction from a control mechanism, an insulation mechanism disconnects the pads from internal circuits on the chip, the connection mechanism connects the pads with the multiplexer, and the multiplexer sequentially makes the binary information available in packets of K bits to the K pads.

28 Claims, 1 Drawing Sheet

INTEGRATED CIRCUIT BINARY DATA OUTPUT INTERFACE FOR MULTIPLEXED OUTPUT OF INTERNAL BINARY INFORMATION ELEMENTS FROM INPUT/OUTPUT PADS

BACKGROUND OF THE INVENTION

1. Field of the Invention

The invention relates to a binary data output interface. It can be applied to the creation of program instructions performed by an ASIC type circuit when it is necessary to be able to supply, outside the circuit, certain internal information elements that are inaccessible at dedicated access pads. This is also called tracing.

2. Discussion of the Related Art

Many integrated circuits, such as application specific integrated circuits (ASICs), have a central processing unit or processor and a program memory. This memory is generally of the ROM (read-only memory) type. The memory is connected to the central processing unit by address, data and control buses and contains a program of instructions performed by the central processing unit.

When an integrated circuit of this kind has to be made on a silicon chip, various tests have to be applied to it. Typically, two distinct types of tests are carried out. First, the circuits physical constitution (the characteristics of the components, connections, etc.) is verified by the sending of stimulation signals. This type of test is performed in practice on all the circuits made, thus this test is done at the development stage and at the batch production stage. The testing of the physical constitution is done, for example, by placing shift registers in the circuits. These shift registers allow the injection of data elements into the circuit, through a series link, and then allow sampling the output, of the logic states present in the internal lines of the circuit through the series link. Furthermore, the logic operation of the circuit, i.e. the way in which it performs the program contained in the program memory, is verified. This type of test is done in the development stage.

To test the running or flow of the program, it is desirable to ascertain whether or not the programmed instructions are sequenced as expected. One method used for this testing consists of stopping the program by the installation of breakpoint devices when certain conditions are verified. This type of test makes it possible to verify, for example, the values placed in the access buses to the central processing unit after a particular instruction is carried out, and then to resume the performance of the program. One drawback of this type of test is that no accurate view is had of the definitive functioning of the circuit since this functioning is disturbed by the fact that the flow of the program is stopped. It is therefore often preferred also to carry out a test under real conditions, namely to observe or trace the flow of the program without stopping it. This observation may be done either in real time or in deferred time.

If it is desired to analyze the real-time flow of the program, an analysis is performed by means of a logic analyzer. The real-time analysis requires that the information elements be obtained directly, during the performance of the program, at the access pads of the circuit. This approach is not acceptable in practice unless these ports have a functional utility in the habitual use of the circuit and are not specifically dedicated to the test. The size of an integrated circuit is directly a function of the number of access pads to this circuit. It is commonly sought to make circuits that are as compact as possible.

To carry out the observation in deferred time, the successive values of the address counter associated with the program memory are stored in the circuit or outside the circuit. Then, an analysis is performed after the fact of the sequencing of these values. In one approach, the information elements are output in series. This makes it possible to resolve the problem of the space requirement but requires that the information output bit rate be low.

One aim of the invention is to enable the output of information elements with a relatively high bit rate from an integrated circuit with a small number of access pads.

SUMMARY OF THE INVENTION

Thus, the invention proposes an integrated circuit comprising input pads and output pads. The pads receive binary data elements or electrical signals as inputs from the exterior and also provide signals as outputs to the exterior. These same pads are connected to one or more internal circuits of the integrated circuit, and form an output interface to output binary information elements to the exterior of the integrated circuit. The binary information elements are encoded on a whole number N of bits and are present on N internal lines of the integrated circuit. The interface comprises an insulation mechanism for the insulation of the pads of the circuit, from the internal circuits to which they are connected. There are a whole number of K pads, with K being smaller than or equal to N internal lines, of the circuit. The interface also comprises a connection mechanism to connect these K pads to the N internal lines of the circuit so that the binary information elements are given to the exterior in packets of K bits.

The invention therefore proposes the use of non-dedicated access pads for the output of the information elements, wherein these information elements are transferred to the exterior in packets of bits.

BRIEF DESCRIPTION OF THE DRAWING

The invention will be understood more clearly and other particular features and advantages shall appear from the following description of embodiments of the invention, given by way of an indication that in no way restricts the scope of the invention, said description being given together with the appended drawing wherein.

DETAILED DESCRIPTION

Figure 1:
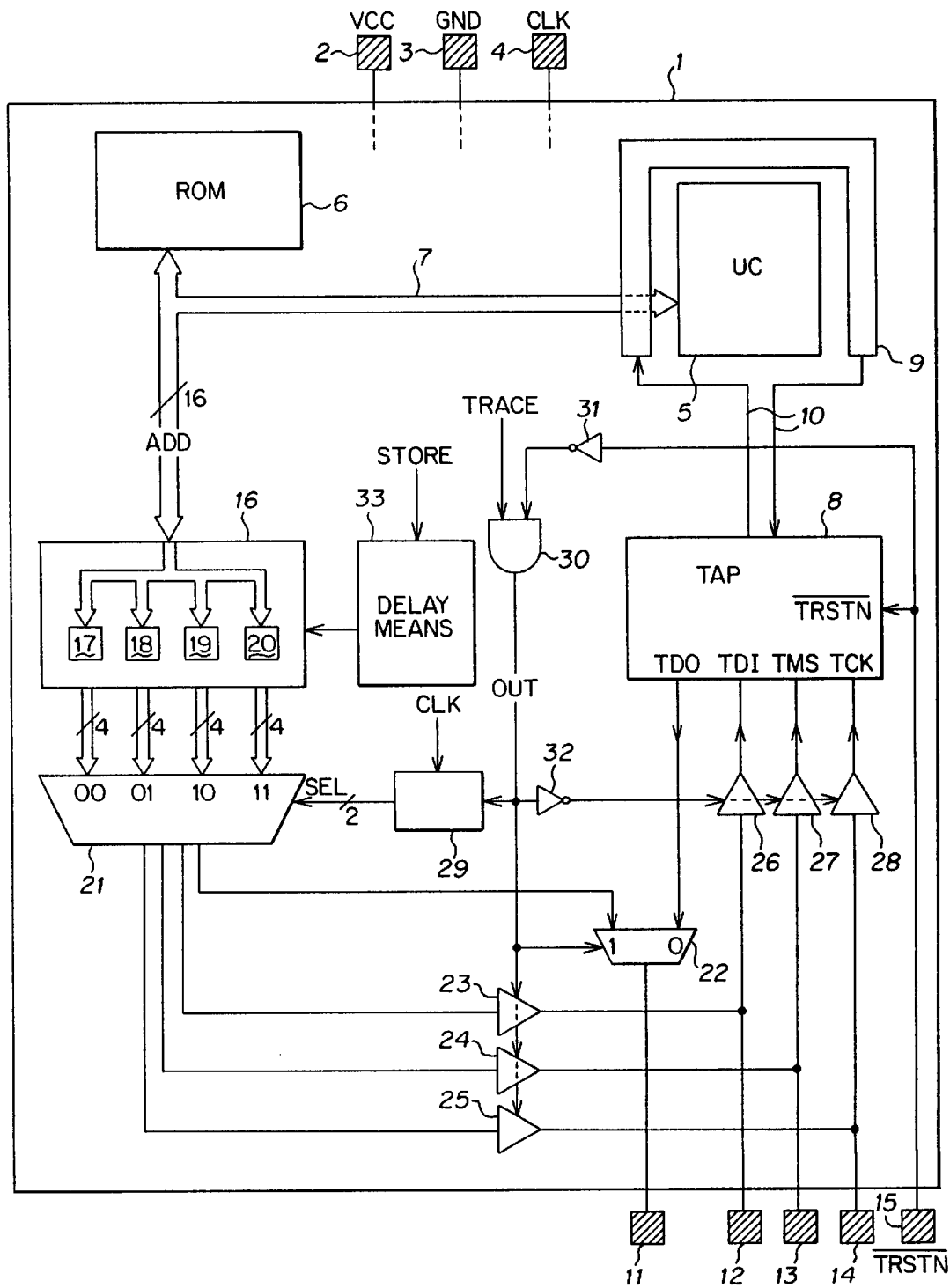
FIG. 1 is a schematic exemplary view of a circuit according to the present invention.

FIG. 1 shows an integrated circuit comprising an interface according to the invention.

Conventionally, the circuit 1 shown comprises two pads 2 and 3 to receive a supply potential VCC and a reference potential GND respective, a central processing unit 5 and a program memory 6 connected by address buses 7, data buses (not shown) and control buses (not shown).

In the example illustrated, it shall be assumed that the central processing unit 5 implements a program of instructions stored in the program memory 6, the flow of the program being paced by a clock signal CLK received on a pad 4 of the circuit.

It shall be assumed, by way of an example, that it is desired to analyze the instructions memorized in the memory 6, and the sequencing of the addresses on the address bus 7, referenced ADD and encoded in binary form on a whole number N of bits. The address bus, ADD, comprises N internal lines of the integrated circuit. It shall be assumed that N=16.

It shall be assumed finally that the circuit 1 further comprises an internal testing circuit 8 enabling the injection or sampling of the binary values on internal lines of the circuit 1 by means of a shift register 9 connected to the testing circuit 8 by lines 10. In the example, it shall be assumed that the testing circuit 8 implements the IEEE standard 1149.1 and is accessible from the outside of the circuit by means of five pads 11 to 15.

The testing circuit 8 comprises:

- a TDI (test data input connected to the pad 12) to receive binary data elements in series,
- a TDO (test data output connected to the pad 11) to give binary data elements in series,
- a TMS (test mode select) control signal input connected to the pad 13,
- a TCK (test clock) signal input connected to the pad 14,
- a reset signal input to receive a /TRSTN (test reset low) signal input connected to the pad 15.

For further details on this type of circuit which is known to those skilled in the art, reference will be made, for example, to Kenneth P. Parker, *The Boundary Scan Handbook,* Kluwer Academic Publishers, 1992.

For an understanding of the example shown, the following facts will be taken into account:

First, the pad 11 is an output, namely it is used by the internal circuit 8 to provide data elements to the exterior of the integrated circuit 1.

Second, the pads 12 to 15 are inputs, i.e. they are used to give the internal circuit 8 data elements or control signals from the exterior of the circuit 1.

And finally, the logic signal /TRSTN represents the use (/TRSTN=1) or non-use (/TRSTN=0) of the internal circuit 8 (usually after the tests on physical structure, the internal circuit 8 is not used and the pad 15 is kept at the ground potential).

The present invention uses the pads 11 to 14 as output pads to give the addresses present on the address bus 7 to the exterior of the circuit 1 in packets of K=4 bits.

The emulation and physical testing resources are therefore combined. This is all the more worthwhile as this type of internal testing circuit is usually present in the integrated circuits, independently of the specific application of the circuit. Thus, in the context of the development of ASICs, the manufacturer generally proposes a circuit core, comprising a central processing unit and resources, which are always present, for carrying out physical testing with a shift register and a certain number of optional devices chosen by the user as a function of his application. This means that there is no beforehand knowledge of what most of the access pads of the circuits will be used for, except for the power supply and ground pads and the pads used to test the constitution of the circuit. Furthermore, once the constitution tests are performed, the internal physical testing circuits are no longer used, nor are their access pads. The present invention advantageously combines the transfer of binary information elements (bits) out of the integrated circuit in packets, with a resource that is always present on the integrated circuit, but in practice, is not used. By making dual use of pads reserved for one use, it is always possible to reduce the cost in terms of number of pads while at the same time putting out information elements at an acceptable pace.

A description shall now be given of the output interface for the addresses ADD.

The interface has a mechanism for storing the binary information elements (ADD addresses) to be output. This storage mechanism is needed inasmuch as the number of pads used is smaller than the number of encoding bits of the information elements. In practice, this will always be the case when the pads used are access pads to a circuit for testing with a shift register, since the access to such circuits is, usually, obtained by series links.

In the example, the storage mechanism comprises a register 16 formed by four sub-registers of four bits 17, 18, 19 and 20. The register 16 has one parallel input connected to the address bus 7 formed by sixteen wires comprising N internal lines where N equals 16. For an address ADD, encoded on sixteen bits, present on the bus 7, this address will be stored in the form of four packets of four bits, each of the sub-registers 17 to 20 enabling the storage of one of the packets. Each of the sub-registers 17 to 20 has a parallel output, enabling its contents to be delivered. Each sub-register output therefore has four wires.

The outputs of the sub-registers 17 to 20 are connected to a multiplexer 21 with four parallel inputs and one parallel output, in such a way that, at the output of the multiplexer 21, the contents of the four sub-registers 17 to 20 are recovered successively. At the output of the multiplexer 21, there are therefore four bits available, corresponding to a packet of an address ADD. The parallel output is formed by four outputs, each of these outputs giving a bit of each four bit packet. The selection of the input connected to the output is done by means of control signals SEL received from a counter 29.

The interface furthermore has a mechanism for the connection of the output of the multiplexer 21 to the pads 11 to 14. This connection mechanism comprises a multiplexer 22 and three tristate buffer circuits referenced 23, 24 and 25.

The multiplexer 22 has one input connected to an output of the multiplexer 21, and it has its input connected to the output TDO of the test circuit 8. The multiplexer 22 has its output connected to the pad 11. Thus, it enables the selective connection of the pad 11 to the output TDO or to one of the outputs of the multiplexer 21.

The three tristate buffer circuits 23, 24 and 25 each comprise an input and an output respectively connected to one of the other three outputs of the multiplexer 21 and to the pads 12, 13 and 14. Thus, it is possible to give the data elements present at the outputs of the multiplexer 21 in parallel at the pads 11 to 14.

The interface has an insulation mechanism to insulate the pads 11 to 14 from the TDI, TMS and TCK inputs and from the TDO output of the test circuit 8. This insulation mechanism comprises the multiplexer 22 (which enables the insulation of the TDO output from the pad 11) and three tristate buffer circuits 26, 27 and 28 which enables the insulation respectively of the pads 12, 13 and 14 from the TDI, TMS and TCK inputs.

Finally, the interface has a control mechanism. In the example illustrated, this control mechanism comprises a counter 29. Advantageously, the counter chosen will be a two-bit counter paced by the clock signal CLK that changes its state at each leading edge of the clock signal CLK. This counter 29 counts from 00 to 11 (in binary mode) in two cycles of the clock signal CLK when it receives a command logic signal OUT in a given state (the high state in the example shown). Thus, the outputs of the multiplexer 21 could be connected successively to the four inputs, in a period of time equal to two cycles of the clock signal CLK.

This signal OUT is produced by an AND gate 30 which has one input connected to the pad 15 by means of an inverter 31 (and therefore receives the signal TRSTN) and one input receiving a command logic signal TRACE. Thus, if TRACE and TRSTN are in the high state, the signal OUT is in the high state. The signal OUT is given to the multiplexer 22 and to the buffer circuits 23, 24 and 25. The complementary signal /OUT (produced by an inverter 32) is given to the buffer circuits 26, 27 and 28. It is assumed here that the buffer circuits 23, 24 and 25 are transparent (with input connected to output) for OUT=1, and that the buffer circuits 26, 27 and 28 are transparent for OUT=0.

The control signal TRACE will be given from the exterior of the circuit 1 or internally (by the central processing unit 5 for example) to indicate that it is desired to output information elements from the circuit 1 by means of the pads 11 to 14. It will be observed that the signal OUT can be replaced by the signal TRSTN. This would lead to the automatic connection of the pads 11 to 14 to the multiplexer when the internal circuit 8 is not used. This would result in no longer complying with the standard IEEE 1149.1 which defines the input or output role of the pads 11 to 14. This could have consequences during the performance of tests on the physical constitution carried out in parallel on several circuits connected through these pads. Furthermore, it is possible that the clock signal TCK will not be stopped when /TRSTN=0.

The advantage of using a control signal TRACE is that the presence of the output interface will be transparent to any user whose operation is limited to using the pads 11 to 14 solely for the use of the test circuit 8. The control signal TRACE will be placed by default in the low logic state implying compliance with the standard IEEE 1149.1 by the circuit 1.

Advantageously, tristate buffer circuits 26, 27 and 28 will be used with the returning of the output to a fixed potential when the input is insulated from the output. In other words, the TDI, TMS and TCK inputs of the test circuit 8 will be taken to fixed potentials when they are insulated from the pads 12 to 14. First, this makes it possible to overcome the need for increased power consumption due to the presence of floating pads (typically, the inputs are the control gates of transistors). Second, by setting TMS at the high potential (VCC), the system remains in a test logic reset state corresponding to the state of non-use of the test circuit 8 (see document referred to, page 15). As for the TDI and TCK inputs, they can be taken to the high potential or to the low potential as required.

Advantageously, a mode of loading the register 16 called ping-pong loading can be implemented, i.e. all the registers 17 to 20 will not be loaded at the same time. If all the registers were to be loaded at the same time, the result would be that the states of the outputs of the multiplexer 21 would be modified as a function of the values loaded into the sub-register connected to these outputs at the time of the loading (in practice, it will be the sub-register containing the last packet to be output). It is possible to envision a case where the loading (through a logic control signal STORE) in the sub-registers is permitted only after a certain period of connection between the outputs of the multiplexer 21 and the sub-register connected to these outputs at the time of the loading. This would mean modifying the control mechanism to keep the counter 29 periodically in a given state. Thus, the output bit rate would be slowed down.

In the invention, the loading of at least the sub-register containing the last output packet is delayed. This loading is done, for example, during the output of the first packet of the following address ADD. It is also possible, for example, to load the sub-registers 17 and 18 while the two sub-registers 19 and 20 are connected to the outputs of the multiplexer 21, and to load the sub-registers 19 and 20 while the sub-registers 17 and 18 are connected to the outputs of the multiplexer 21. For this purpose, it is possible to delay the application, to the sub-registers 19 and 20, of the control signal (referenced STORE in FIG. 1) that enables the loading of the sub-registers 17 to 20. To do this, it is possible to make the signal STORE go through a delay flip-flop circuit (DELAY MEANS 33). Thus, the invention provides for a regular and temporally optimized output of the packets.

It will be observed that the IEEE 1149.1 standard provides for the possibility of using only four pads, the resetting being activated through the use of the pads that give TMS and TCK. This enables a reduction in the number of pads of a unit. The invention can be applied in this configuration but it is possible to use only the pads connected to TDI and TDO for the output of the bits. Thus, the output bit rate is halved as compared with the example shown in FIG. 1. This output bit rate however remains twice the series output bit rate.

Although the invention has been described with reference to a preferred exemplary embodiment, it will be understood that a variety of alternative embodiments could be provided without departing from the framework of the invention. Thus, it will be clearly understood that the pads 11 to 14 will not necessarily be connected to an internal testing circuit and to an address bus. It could also be connected and an internal testing circuit according to a standard different from the IEEE 1149.1 standard. Furthermore, the size and number sub-registers will be adapted as a function of N and K. N will not necessarily be a multiple of K, in which case it will be possible to complete the values of the last sub-register by wiring its unused inputs to fix potentials. It is also possible to have K=N, in which case it would possible to do without the information storage mechanism.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. An integrated circuit comprising:
   pads to receive first binary information elements in the form of electrical signals from the exterior of the integrated circuit and to output electrical signals to the exterior of the integrated circuit, said pads being connected to at least one internal circuit of the integrated circuit; and
   an output interface to give second binary information elements to the pads, wherein said second binary information elements are represented by a whole number N of bits and are present on N internal lines of the integrated circuit connected to the output interface;
   wherein the output interface is connected to K of said pads, wherein K is a whole number smaller than or equal to N, and includes:
   a means for insulating said K pads, from the internal circuits to which they are connected; and
   a connecting means to selectively connect to said K pads and to provide to said K pads the second binary information elements represented by N bits and present on the N internal lines of the circuit so that the second binary information elements are given to the exterior in packets of K bits.

2. A circuit according to claim 1, wherein said means for insulating said K pads comprises at least one tristate buffer to insulate the pads from the internal circuits.

3. A circuit according to claim 1, wherein the internal circuit is an internal testing circuit of the integrated circuit.

4. A circuit according to claim 3, wherein said internal testing circuit operates according to IEEE.1149.1 standard.

5. An integrated circuit comprising:
pads to receive first binary information elements in the form of electrical signals from the exterior of the integrated circuit and to output electrical signals to the exterior of the integrated circuit, said pads being connected to at least one internal circuit of the integrated circuit; and
an output interface to give second binary information elements to the pads, wherein said second binary information elements are represented by a whole number N of bits and are present on N internal lines of the integrated circuit connected to the output interface;
wherein the output interface is connected to K of said pads, wherein K is a whole number smaller than or equal to N and includes
a means for insulating said K pads, from the internal circuits to which they are connected; and
a connecting means to selectively connect to said K pads and to provide to said K pads the second binary information elements represented by N bits and present on the N internal lines of the circuit so that the second binary information elements are given to the exterior in packets of K bits; and
wherein, N being greater than K, the output interface further comprises a storage means for storing, in packets of K bits, the N bits of the second binary information elements to be output; and
wherein said connecting means comprises a multiplexer to successively select said binary information elements in packets of K-bits from said storage means and output said packets to said K pads.

6. A circuit according to claim 5, wherein the storage means are formed by K-bit registers.

7. A circuit according to claim 4, further comprising a delay means for delaying the storage of the second binary information elements in at least one of said K-bit registers and for delaying the multiplexer from successively selecting at least one of said packets of K-bits in said K-bit registers.

8. A circuit according to claim 5, wherein said connecting means is controlled by a binary counter that is incremented at each leading edge of a clock signal pacing the operation of the integrated circuit.

9. An integrated circuit comprising:
pads to receive first binary information elements in the form of electrical signals from the exterior of the integrated circuit and to output electrical signals to the exterior of the integrated circuit, said pads being connected to at least one internal circuit of the integrated circuit; and
an output interface to give second binary information elements to the pads, wherein said second binary information elements are represented by a whole number N of bits and are present on N internal lines of the integrated circuit connected to the output interface;
wherein the output interface is connected to K of said pads, wherein K is a whole number smaller than or equal to N, and includes:
a means for insulating said K pads from the internal circuits to which they are connected; and
a connecting means to selectively connect to said K pads and to provide to said K pads the second binary information elements represented by N bits and present on the N internal lines of the circuit so that the second binary information elements are given to the exterior in packets of K bits; and
wherein the internal circuit is an internal testing circuit of the integrated circuit;
wherein said internal testing circuit operates according to IEEE.1149.1 standard;
wherein said pads connected to said internal testing circuit include a data input (TDI), a data output (TDO), a control signal input (TMS), a test clock signal input (TCK), and a test reset signal (/TRSTN); and
wherein said test reset signal (/TRSTN) is connected to said means for insulating and said connecting means in such a way that the K pad connections are switched between being connected to said internal testing circuit and being connected to the output interface, as a function of the state of said test reset signal (/TRSTN).

10. An integrated circuit comprising:
pads to receive first binary information elements in the form of electrical signals from the exterior of the integrated circuit and to output electrical signals to the exterior of the integrated circuit, said pads being connected to at least one internal circuit of the integrated circuit; and
an output interface to give second binary information elements to the pads, wherein said second binary information elements are represented by a whole number N of bits and are present on N internal lines of the integrated circuit connected to the output interface;
wherein the output interface is connected to K of said pads, wherein K is a whole number smaller than or equal to N, and includes:
a means for insulating said K pads, from the internal circuits to which they are connected; and
a connecting means to selectively provide to said K pads the second binary information elements represented by N bits and present on the N internal lines of the circuit so that the second binary information elements are given to the exterior in packets of K bits;
wherein said means for insulating said K pads comprises at least one tristate buffer to insulate the pads from the internal circuits;
wherein, N being greater than K, the output interface further comprises a storage means for the storage, in packets of K bits, the N bits of the second binary information elements to be output; and
wherein said connecting means comprises a multiplexer to successively select said second binary information elements in packets of K-bits from said storage means and output said packets to said K pads.

11. A method for connecting access pads to lines of an integrated circuit, comprising the steps of:
selectively connecting the access pads to lines of an internal circuit of the integrated circuit, in order to input and output data from said internal circuit; and
selectively connecting the access pads to lines of a bus of said integrated circuit for outputting binary information elements from said lines of said bus to said access pads.

12. The method according to claim 11, further comprising the steps of:
insulating said access pads from said lines of said internal circuit within the integrated circuit while they are connected to said lines of said bus; and insulating said access pads from said lines of said bus within the integrated circuit, while said access pads are connected to said internal circuit.

13. The method according to claim 12, further comprising the step of:

applying a reset signal to an access pad to control the insulating steps.

14. A method for connecting access pads to lines of an integrated circuit, comprising the steps of:

selectively connecting the access pads to lines of an internal circuit of the integrated circuit, in order to input and output data from said internal circuit; and selectively connecting the access pads to lines of a bus of said integrated circuit for outputting binary information elements from said lines of said bus to said access pads;

wherein the step of selectively connecting said access pads to said lines of said bus further comprises the step of storing binary information elements on said lines of said bus, in a plurality of K-bit registers, as K-bit packets, to be output from K of said access pads.

15. The method of claim 14, further comprising the step of:

successively selecting one of the K-bit registers to output the corresponding K-bit packet to said access pads.

16. The method according to claim 15, wherein said selecting step comprises the step of:

controlling selection of the K-bit registers based upon leading edges of a clock signal from the integrated circuit.

17. The method according to claim 14, wherein said step of selectively connecting further comprises the step of:

providing a control signal to activate said storing step.

18. An integrated circuit comprising:

a memory;

a bus having a plurality of internal lines for transmitting binary information to and from said memory;

a plurality of access pads used for sending and receiving electrical signals into and out from said integrated circuit;

an internal circuit;

a storage means connected to the bus for storing binary information elements from said bus;

a first group of a plurality of buffer circuits connected to the internal circuit;

a second group of a plurality of buffer circuits coupled to the storage means;

wherein each access pad of a portion of said plurality of access pads is connected to a corresponding buffer circuit in said first group and a corresponding buffer circuit in said second group.

19. The integrated circuit according to claim 18, wherein said storage means includes a plurality of K-bit registers, storing said binary information elements in K-bit packets; and wherein the integrated circuit includes a first multiplexer connected between said storage means and said second group of buffer circuits; and a binary counter connected to said first multiplexer to select a K-bit packet stored in one of said K-bit registers to be output to said second group of buffer circuits.

20. The integrated circuit apparatus according to claim 19, wherein said first multiplexer includes K output lines coupled to K of said access pads to output the selected K-bit packets.

21. The integrated circuit apparatus according to claim 18, further comprising:

a selection access pad wherein said first group of buffer circuits and said second group of buffer circuits are selectively activated by a selection signal input from said selection access pad.

22. The integrated circuit apparatus according to claim 18, further comprising:

a second multiplexer having a first input connected to the internal circuit, a second input connected to the storage means, and an output connected to at least one of said access pads.

23. An output interface to output binary information elements from an integrated circuit having a plurality of access pads connected to at least one internal circuit, the output interface comprising:

a storage means, connected to bus lines of said integrated circuit, for storing binary information elements from said bus lines; and an outputting means, connected between said storage means and said plurality of access pads, for transferring said stored binary information elements from said storage means to said access pads.

24. The output interface according to claim 23, wherein said at least one internal circuit includes a test circuit.

25. The output interface according to claim 24 wherein said access pads are connected to said test circuit according to IEEE.1149.1 standard.

26. The output interface according to claim 23 further comprising:

a first insulation means for insulating said access pads from said internal circuit during operation of said output interface.

27. The output interface according to claim 23 further comprising:

second insulation means for insulating said access pads from said output interface during operation of said internal circuit.

28. An output interface to output binary information elements from an integrated circuit having a plurality of access pads connected to at least one internal circuit, the output interface comprising:

a storage means, connected to bus lines of said integrated circuit, for storing binary information elements from said bus lines; and an outputting means, connected between said storage means and said plurality of access pads, for transferring said stored binary information elements from said storage means to said access pads;

wherein:

said storage means includes a plurality of registers, each register storing a K-bit packet of the binary information elements; and said outputting means includes a multiplexer having K outputs connected to certain of said access pads, and inputs connected to said plurality of registers.

* * * * *